(12) United States Patent
Chiu et al.

(10) Patent No.: US 12,100,641 B2
(45) Date of Patent: Sep. 24, 2024

(54) ELECTRONIC PACKAGE AND METHOD FOR MANUFACTURING THE SAME

(71) Applicant: SILICONWARE PRECISION INDUSTRIES CO., LTD., Taichung (TW)

(72) Inventors: Chih-Hsien Chiu, Taichung (TW); Siang-Yu Lin, Taichung (TW); Wen-Jung Tsai, Taichung (TW); Chia-Yang Chen, Taichung (TW); Chien-Cheng Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 18/223,221

(22) Filed: Jul. 18, 2023

(65) Prior Publication Data
US 2023/0360997 A1   Nov. 9, 2023

Related U.S. Application Data

(63) Continuation of application No. 17/379,289, filed on Jul. 19, 2021, now Pat. No. 11,749,583.

(30) Foreign Application Priority Data

May 21, 2021 (TW) .................... 110118447

(51) Int. Cl.
*H01L 23/42* (2006.01)
*H01L 21/56* (2006.01)
*H01L 23/16* (2006.01)
*H01L 23/31* (2006.01)
*H01L 23/367* (2006.01)

(52) U.S. Cl.
CPC ............ *H01L 23/42* (2013.01); *H01L 21/561* (2013.01); *H01L 23/16* (2013.01); *H01L 23/3128* (2013.01); *H01L 23/367* (2013.01)

(58) Field of Classification Search
CPC ..... H01L 23/42; H01L 23/16; H01L 23/3128; H01L 23/367; H01L 21/561
See application file for complete search history.

(56) References Cited

U.S. PATENT DOCUMENTS

| 9,184,139 | B2 | 11/2015 | Choi |
| 9,620,430 | B2 | 4/2017 | Lu |
| 10,784,230 | B2 * | 9/2020 | Chen ..................... H01L 21/56 |
| 2013/0273694 | A1 | 10/2013 | Hsieh |

(Continued)

*Primary Examiner* — Peniel M Gumedzoe
(74) *Attorney, Agent, or Firm* — Dority & Manning, P.A.

(57) ABSTRACT

An electronic package is provided, which includes a plurality of electronic components encapsulated by an encapsulation layer. A spacer is defined in the encapsulation layer and located between at least two adjacent electronic components of the plurality of electronic components, and a recess is formed in the spacer and used as a thermal insulation area. With the design of the thermal insulation area, the plurality of electronic components can be effectively thermally insulated from one another to prevent heat generated by one electronic component of high power from being conducted to another electronic component of low power that would thermally affect the operation of the low-power electronic component. A method for manufacturing the electronic package is also provided.

26 Claims, 6 Drawing Sheets

(56) References Cited

U.S. PATENT DOCUMENTS

2015/0311182 A1 10/2015 Lee
2016/0167949 A1* 6/2016 Jiang ................. B81C 3/001
　　　　　　　　　　　　　　　　　　　　　257/415

* cited by examiner

ELECTRONIC PACKAGE AND METHOD FOR MANUFACTURING THE SAME

CROSS-REFERENCE TO RELATED APPLICATIONS

This is a Continuation of co-pending U.S. Ser. No. 17/379,289, filed Jul. 19, 2021. This application claims priority to Taiwan Application Serial No. 110118447, filed on May 21, 2021. The entirety of the above-mentioned patent application is hereby incorporated by reference herein and made a part of this specification.

BACKGROUND

1. Technical Field

The present disclosure relates to a semiconductor device, and more particularly, to an electronic package and a method for manufacturing the same.

2. Description of Related Art

In the face of the rapid development in 5G, the focus of electronic products has been shifting towards heterogeneous integration. In order to shorten the trace distances between high-performance processing chips and memories and to improve signal integrity, multi-chip module (MCM)/multi-chip package (MCP) solutions have been developed to satisfy the needs for integrating high-performance chips and memories (DDR/HBW memories) into a unifying package.

Figure 1:
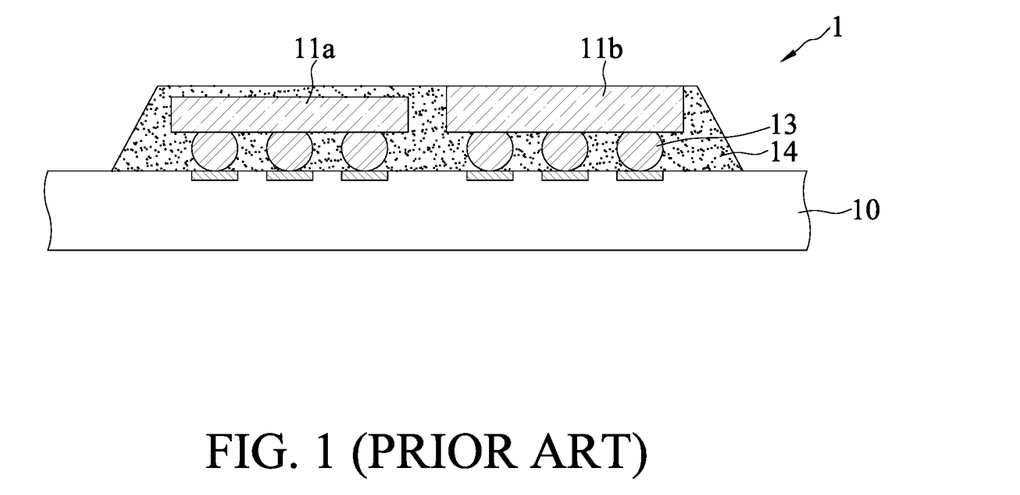
FIG. 1 is a schematic cross-sectional view of a conventional multi-chip package structure.

As shown in a MCP structure 1 in FIG. 1, a plurality of semiconductor chips 11a, 11b are bonded onto a package substrate 10 via a plurality of solder bumps 13, and an encapsulant 14 is then formed to encapsulate the plurality of semiconductor chips 11a, 11b. By packaging multiple semiconductor chips into a single semiconductor chip, the package can have more input/output (I/O) pins, the computational performance of the processor can be significantly improved and signal latency can be reduced, making it suitable for use in high-end products, such as those with circuits in high density/high transmission speed/greater numbers of stacked layers/of large scale.

In addition, the operating temperature range of the existing memory-type semiconductor chip 11a needs to be strictly controlled to maintain normal operation.

However, the semiconductor chip 11b with high computational functionality, such as a system on a chip (SoC), generates a substantial amount of heat during operation. Thus, when the plurality of semiconductor chips 11a, 11b are incorporated within the same encapsulant 14, the heat generated by the semiconductor chip 11b with high computational functionality may considerably affect the operation of the memory-type semiconductor chip 11a.

Therefore, there is a need for a solution that addresses the aforementioned issues of the prior art.

SUMMARY

In view of the aforementioned shortcomings of the prior art, the present disclosure provides an electronic package, which includes: a plurality of electronic components; and an encapsulation layer encapsulating the plurality of electronic components, wherein a spacer is defined in the encapsulation layer and located between at least two adjacent electronic components of the plurality of electronic components, and a recess is formed in the spacer and used as a thermal insulation area, wherein a depth of the recess is greater than a height of the plurality of electronic components.

The present disclosure further provides a method for manufacturing an electronic package, which includes: providing a plurality of electronic components; encapsulating the plurality of electronic components with an encapsulation layer, wherein a spacer is defined in the encapsulation layer and located between at least two adjacent electronic components of the plurality of electronic components; and forming a recess in the spacer, wherein the recess is used as a thermal insulation area and a depth of the recess is greater than a height of the plurality of electronic components.

In the aforementioned electronic package and method for manufacturing the same, the thermal insulation area is filled with air.

In the aforementioned electronic package and method for manufacturing the same, the thermal insulation area is filled with an insulating material.

In the aforementioned electronic package and method for manufacturing the same, a thermal conductivity of the thermal insulation area is less than a thermal conductivity of the encapsulation layer.

In the aforementioned electronic package and method for manufacturing the same, a thermal conductivity of the thermal insulation area is less than 0.02 W/mK.

In the aforementioned electronic package and method for manufacturing the same, a width of the recess is at least 50 µm.

In the aforementioned electronic package and method for manufacturing the same, the recess is free from being penetrated through the spacer. For example, a thickness of the encapsulation layer at the spacer is at least 10 µm.

The aforementioned electronic package and method for manufacturing the same further include carrying and electrically connecting with the plurality of electronic components by a carrier, wherein the carrier includes two opposite sides, such that the plurality of electronic components are disposed on one of the two opposite sides of the carrier, and a plurality of conductive components are disposed on the other one of the two opposite sides of the carrier. For example, the recess extends to the carrier. Furthermore, the recess penetrates through the carrier.

In the aforementioned electronic package and method for manufacturing the same, each of the electronic components includes an active face, a non-active face opposite to the active face, and side faces adjacent to the active face and the non-active face, such that the spacer is connected with the side faces of the plurality of electronic components. For example, the recess is exposed from the side faces of the electronic components.

The aforementioned electronic package and method for manufacturing the same further include a heat dissipating member bonded to the plurality of electronic components and covering the recess. For example, the heat dissipating member is bonded onto the plurality of electronic components via a bonding layer. Furthermore, the bonding layer is filled in the recess but is free from being filled up the recess.

It can be understood from the above, the electronic package and the method for manufacturing the same in accordance with the present disclosure allow the electronic components to be effectively thermally insulated from one another by employing the design of the thermal insulation area, thereby preventing heat generated by an electronic component of high power from being conducted to another electronic component of low power. Therefore, compared to the prior art, the present disclosure can effectively prevent heat generated by the high-power electronic components from adversely affecting the operation of the low-power electronic components, thereby enhancing the reliability of the electronic package.

BRIEF DESCRIPTION OF THE DRAWINGS

FIG. 2A, FIG. 2B-1 and FIG. 2C-1 are schematic cross-sectional views illustrating a method for manufacturing an electronic package in accordance with the present disclosure.

FIG. 2B-2 is a schematic partial top view of FIG. 2B-1.

FIG. 2C-2 is a partially enlarged cross-sectional view depicting another aspect of FIG. 2C-1.

FIG. 4A and FIG. 4B-1 are schematic partial cross-sectional views of an electronic package in accordance with different embodiments of the present disclosure.

FIG. 4B-2 is a schematic overall top view of the electronic package shown in FIG. 4B-1.

FIG. 4B-3 and FIG. 4B-4 are schematic top views depicting other aspects of FIG. 4B-2.

DETAILED DESCRIPTION OF THE EMBODIMENTS

Implementations of the present disclosure are illustrated using the following embodiments. One of ordinary skill in the art can readily appreciate other advantages and technical effects of the present disclosure upon reading the content of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Any modifications, changes or adjustments to the structures, ratio relationships or sizes, are to be construed as falling within the range covered by the technical content disclosed herein to the extent of not causing changes in the technical effects created and the objectives achieved by the present disclosure, Meanwhile, terms such as "above," "below," "first," "second," "a," "an," and the like recited here are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIG. 2A, FIG. 2B-1 and FIG. 2C-1 are schematic cross-sectional views illustrating a method for manufacturing an electronic package 2 in accordance with the present disclosure.

Figure 2A:
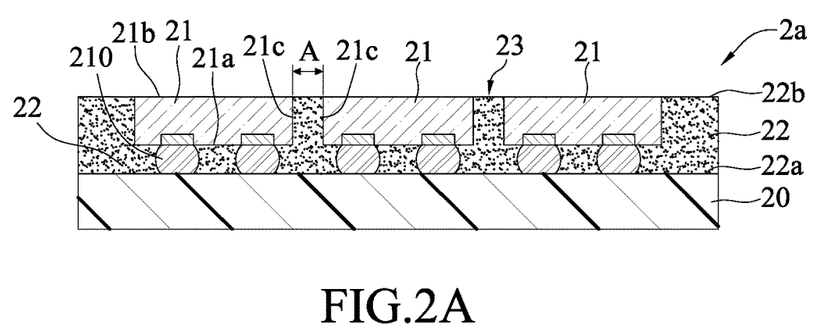
Figure 2B:
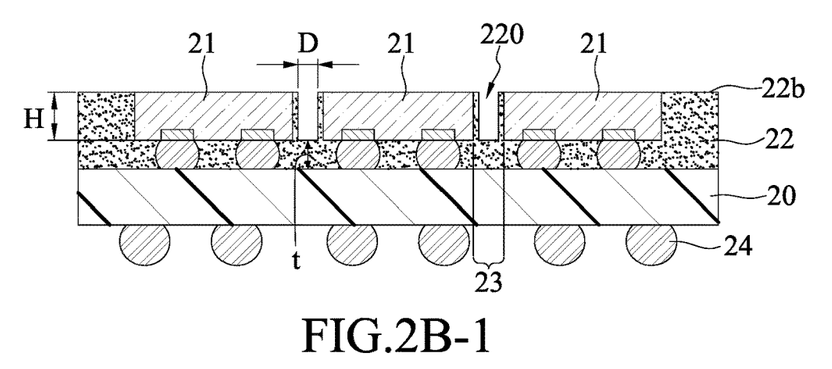

As shown in FIG. 2A, a multi-chip package (MCP) 2a is provided and includes a carrier 20, a plurality of electronic components 21 and an encapsulation layer 22.

The carrier 20 may be, for example, a package substrate with a core layer and circuit structures, a coreless package substrate with circuit structures, a through-silicon interposer (TSI) with through-silicon vias (TSVs), or other types of boards that include at least one insulating layer and at least one circuit layer bonded to the insulating layer, such as a fan-out redistribution layer (RDL). It can be understood that the carrier 20 may also be other types of boards for carrying chips, such as a lead frame, a wafer, or other types of boards having metal routing, etc., and the present disclosure is not limited to the above.

In an embodiment, the carrier 20 can be made in a number of ways. For example, the circuit layer can be manufactured using a wafer manufacturing process, and silicon nitride or silicon oxide can be formed by chemical vapor deposition (CVD) as the insulating layer. Alternatively, the circuit layer can be formed using a general non-wafer process, and a cheap polymer dielectric material, such as a polyimide (PI), polybenzoxazole (PBO), a prepreg (PP), a molding compound, a photosensitive dielectric layer, or other types of materials, can be applied as the insulating layer by coating.

Moreover, a plurality of conductive components 24 can be formed on the underside of the carrier 20 in a subsequent process (shown in FIG. 2B-1) as external contacts for attaching to an electronic device, such as a circuit board (not shown). The conductive components 24 may be metal pillars (e.g., copper pillars), metal-clad insulating bumps, solder balls, solder balls having copper cores, or other types of conductive structures.

The plurality of electronic components 21 are disposed apart from one another on the upper side of the carrier 20.

The electronic component 21 is an active component, a passive component, or a combination of both. The active component can be, for example, a semiconductor chip, and the passive component can be, for example, a resistor, a capacitor or an inductor. In an embodiment, the electronic component 21 is a semiconductor chip having an active face 21a, a non-active face 21b opposite to the active face 21a, and side faces 21c adjacent to the active face 21a and the non-active face 21b. Electrode pads on the active face 21a are disposed to the carrier 20 in a flip-chip manner via a plurality of conductive bumps 210 (e.g., solder materials, metal pillars, etc.) and electrically connected to the circuit layer. Alternatively, the electronic component 21 can be electrically connected to the circuit layer of the carrier 20 in a wire bonding manner via a plurality of solder wires (not shown). Alternatively, the electronic component 21 can be in direct contact with the circuit layer of the carrier 20. Therefore, electronic components of the required types and quantity can be attached onto the carrier 20 to improve the electrical functions. There are numerous ways in which the electronic component 21 can be electrically connected to the carrier 20, and the present disclosure is not limited to the above.

Moreover, a gap A is formed between two adjacent side faces 21c of the electronic components 21.

The encapsulation layer 22 is formed on the carrier 20 and in the gap A to encapsulate the electronic components 21.

In an embodiment, the material forming the encapsulation layer 22 is an insulating material, for example, an encapsulant such as PI or epoxy resin, and can be formed by molding, lamination, coating, or the like.

Moreover, the encapsulation layer 22 includes a first surface 22a and a second surface 22b opposite to the first surface 22a. The first surface 22a is bonded with the carrier 20, and the non-active faces 21b of the electronic components 21 are flush with the second surface 22b of the encapsulation layer 22, such that the electronic components 21 are exposed from the second surface 22b of the encapsulation layer 22. Alternatively, an encapsulation layer 32 can also cover the non-active faces 21b of the electronic components 21, such as that shown in FIG. 3, that is, a second surface 32b of the encapsulation layer 32 is at a higher level than the non-active faces 21b of the electronic components 21. It can be understood that a planarization process can be performed on the second surface 32b of the encapsulation layer 32 shown in FIG. 3, for example, by grinding, cutting, etching, or the like to obtain the encapsulation layer 22 shown in FIG. 2A.

Also, the gap A is filled with the encapsulation layer 22 to serve as a spacer 23 (spacer structure) between at least two adjacent electronic components 21 of the plurality of electronic components 21. For example, the spacer 23 is connected onto the side faces 21c of the adjacent electronic components 21, so that the electronic components 21 are connected with each other.

As shown in FIG. 2B-1, a recess 220 is formed on the second surface 22b of the encapsulation layer 22 at locations corresponding to each of the spacers 23. A plurality of conductive components 24 are further formed on the underside of the carrier 20. The conductive components 24 are electrically connected with the carrier 20.

Figure 2B:
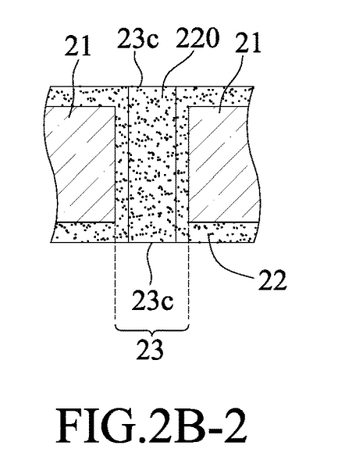
Figure 2C:
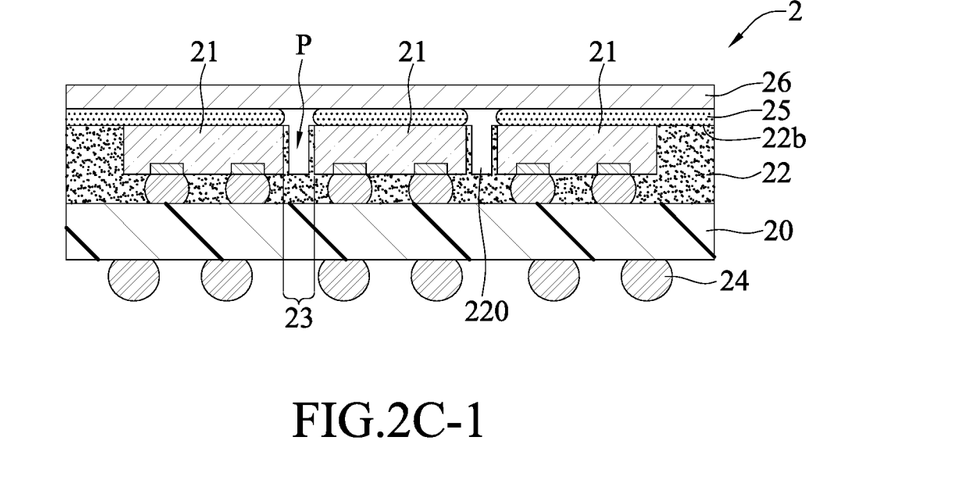

In an embodiment, a portion of the encapsulation layer 22 is removed by cutting, laser, or etching to form the recess 220, and the width D of the recess 220 from the opening of the notch to the bottom of the notch (i.e., from top to bottom of the recess 220) can be uniform (as shown in FIG. 2B-1) or not uniform. Furthermore, the recess 220 interconnects two opposite sides 23c (i.e., front and back sides) of the spacer 23, as shown in FIG. 2B-2.

Moreover, the depth H of the recess 220 can be designed according to needs. For instance, as shown in FIG. 2B-1, the recess 220 is free from being penetrated through the spacer 23 (e.g., the bottom of the recess 220 is at the same level as the active face 21a of the electronic component 21 with respect to the carrier 20); or alternatively, the depth of the recess 220 can penetrate through the spacer 23, such that the surface of the carrier 20 is exposed.

Figure 4A:
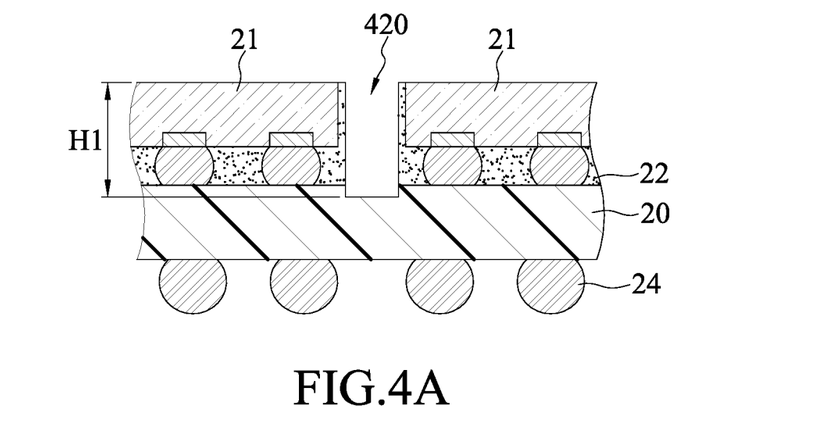
Figure 4B:
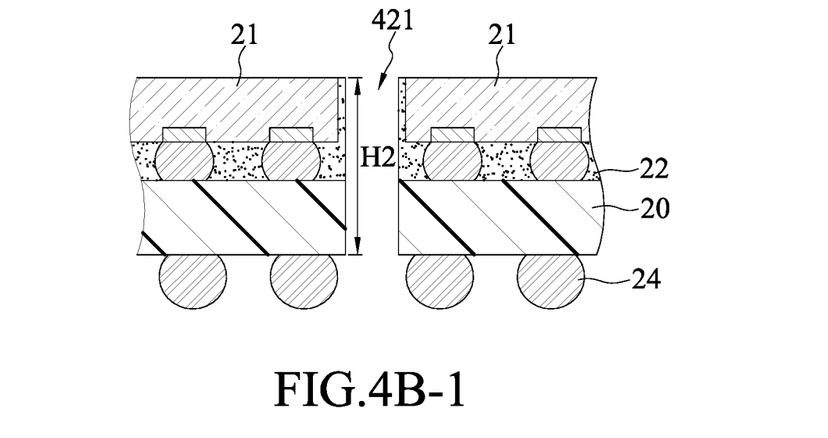
Figure 4B:
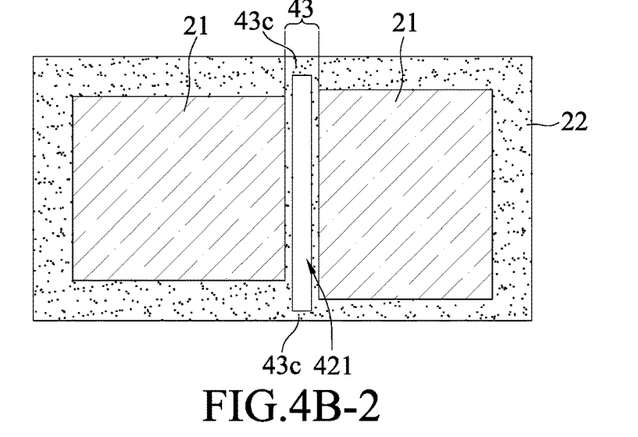
Figure 4B:
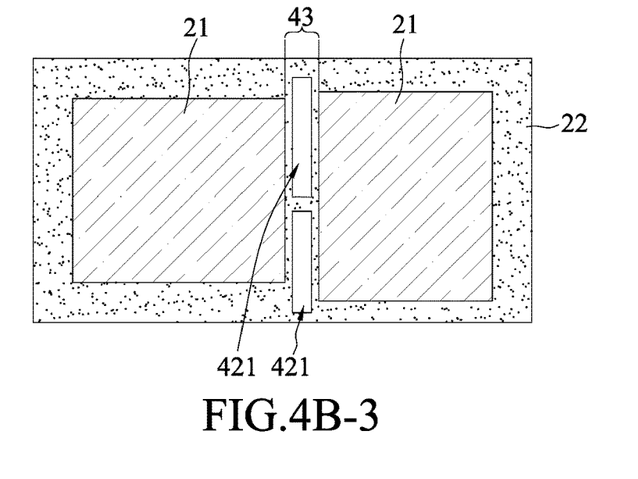
Figure 4B:
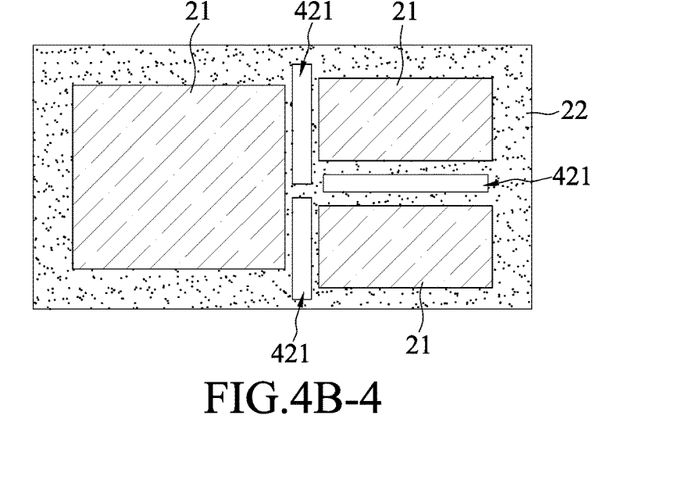

As yet another alternative, the depth H1 of a recess 420 shown in FIG. 4A extends to the carrier 20, or even penetrates through the carrier 20 (e.g., illustrated by a recess 421 with a depth H2 shown in FIG. 4B-1). It can be understood that when the recess 421 penetrates through the carrier 20, depending on the needs, the recess 421 may still interconnect the two opposite sides 43c (i.e., front and back sides) of the spacer 43 (spacer structure), as shown in FIG. 4B-2. Alternatively, as shown in FIG. 4B-3 or FIG. 4B-4, a plurality of recesses 421 can be formed in the spacer 43. If the recess 421 is designed to disconnect the two opposite sides 43c of the spacer 43, the encapsulation layer 22 may still be connected through a bonding layer 25 and a heat dissipating member 26, which will be described later.

Furthermore, when the recess 220 is free from being penetrated through the spacer 23, a distance of at least 10 μm can be reserved between the bottom of the recess 220 and the carrier 20, that is, the thickness t of the encapsulation layer 22 at the spacer 23 is at least 10 μm. As such, the strength of the electronic package 2 can be increased.

In addition, as shown in FIG. 2C-1, in subsequent manufacturing processes, a bonding layer 25 can be formed on the non-active faces 21b of the electronic components 21 and the second surface 22b of the encapsulation layer 22 according to needs, and the recesses 220 are exposed. Thereafter, a heat dissipating member 26 is provided on the non-active faces 21b of the plurality of electronic components 21 via the bonding layer 25, and the bonding layer 25 is later cured.

Figure 2C:
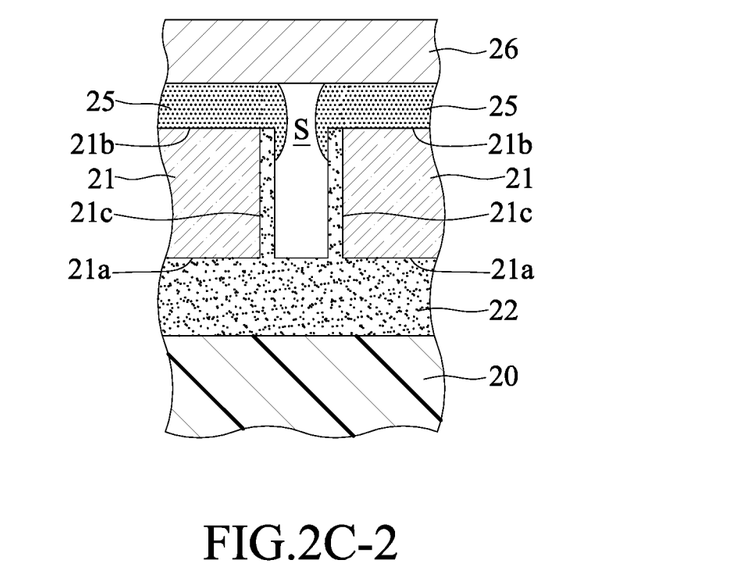

In an embodiment, the bonding layer 25 is a liquid heat dissipating gel or other types of resins to be used as a thermal interface material (TIM). The bonding layer 25 is free from being filled in the recesses 220. In the case where the bonding layer 25 is filled in the recesses 220, the bonding layer 25 is free from being filled up the recesses 220, as shown in FIG. 2C-2. As such, the recesses 220 will form airflow space S interconnected to the heat dissipating member 26.

Furthermore, the heat dissipating member 26 can be a heat sink with fins, and the underside of the heat dissipating member 26 is in contact with the bonding layer 25. It can be understood that there are numerous types of heat dissipating member 26, and the present disclosure is not limited to the above.

Figure 3:
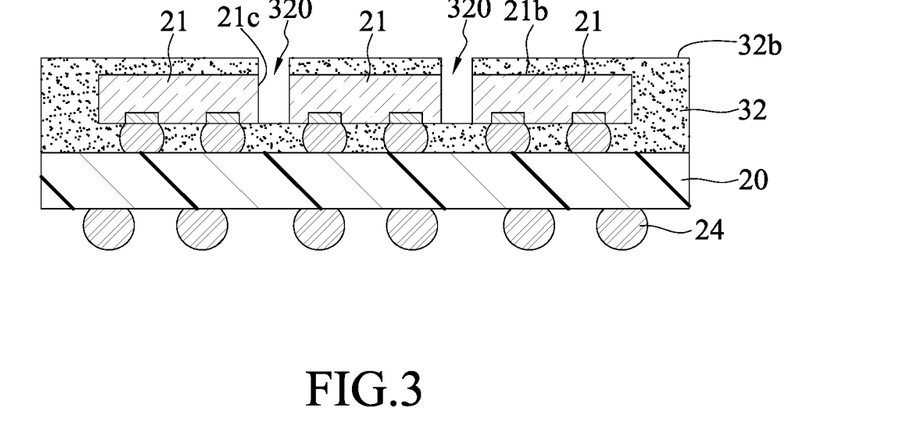
FIG. 3 is an enlarged cross-sectional view illustrating an alternative manufacturing method of FIG. 2A.

Therefore, the method for manufacturing the electronic package 2 in accordance with the present disclosure includes forming a recess 220, 420, 421 from a spacer 23, 43 between two adjacent electronic components 21 to be used as a thermal insulation area P with high thermal resistance (e.g., air), so that the thermal insulation can be effectively achieved between the electronic components 21. This prevents heat emitted by an electronic component 21 of high power (e.g., 2 watts) from being conducted to another electronic component 21 of lower power (e.g., 0.3 watts), wherein the width D of the recess 220 is at least 50 μm, or even equal to the width of the spacer 23, 43 to expose the side faces 21c of the electronic components 21 (e.g., the walls of recesses 320 in FIG. 3 are flush with the side faces 21c) to achieve great thermal insulation.

Moreover, the thermal insulation area P can include air (which has greater thermal resistance) or an insulating material (e.g., the bonding layer 25), and the thermal conductivity (thermal conductivity coefficient) of the thermal insulation area P is less than the thermal conductivity of the encapsulation layer 22, 32. For example, the thermal conductivity of the thermal insulation area P is less than 0.02 W/mK. As a result, with the thermal insulation area P, the electronic package 2 can effectively prevent heat generated by an electronic component 21 (a high-power component, such as a SoC) from adversely affecting the operation of another electronic component 21 (a low-power component, such as a memory).

In addition, there are numerous types of electronic package 2 in accordance with the present disclosure, and the present disclosure is not limited to the above. For example, an electronic package adopting the wafer-level chip scale packaging technique includes electronic components 21 embedded in an encapsulation layer 22, and a plurality of conductive components 24 are directly formed on the active faces 21a of the electronic components 21 as external contacts for attaching to an electronic device, such as a circuit board (not shown), and the manufacturing of the carrier 20 is omitted.

The present disclosure further provides an electronic package 2, which includes a plurality of electronic components 21 and an encapsulation layer 22, 32 for encapsulating the electronic components 21.

A spacer 23, 43 is defined in the encapsulation layer 22, 32 and located between at least two adjacent electronic components 21 of the plurality of electronic components 21, and a recess 220, 320, 420, 421 is formed in the spacer 23, 43 to be used as a thermal insulation area P.

In an embodiment, the thermal insulation area P is filled with air or an insulating material.

In an embodiment, the thermal conductivity of the thermal insulation area P is less than the thermal conductivity of the encapsulation layer 22, 32.

In an embodiment, the thermal conductivity of the thermal insulation area P is less than 0.02 W/mK.

In an embodiment, the width D of the recess 220, 320, 420, 421 is at least 50 μm.

In an embodiment, the recess 220, 320 is free from being penetrated through the spacer 23. For example, the thickness t of the encapsulation layer 22, 32 at the spacer 23 is at least 10 μm.

In an embodiment, the electronic package 2 further includes a carrier 20 carrying and electrically connected with the plurality of electronic components 21. The carrier 20 includes two opposite sides, such that the plurality of electronic components 21 are disposed on one of the two opposite sides of the carrier 20, and a plurality of conductive components 24 are disposed on the other one of the two opposite sides of the carrier 20, such that the plurality of conductive components 24 are electrically connected with the plurality of electronic components 21 via the carrier 20. In an embodiment, the recess 420, 421 extends to the carrier 20. Furthermore, the recess 421 penetrates through the two opposite sides of the carrier 20.

In an embodiment, the electronic component 21 includes an active face 21a, a non-active face 21b opposite to the active face 21a, and side faces 21c adjacent to the active face 21a and the non-active face 21b, such that the spacer 23, 43 is connected with the side faces 21c of the plurality of electronic components 21.

In an embodiment, the electronic package 2 further includes a heat dissipating member 26 bonded to the plurality of electronic components 21 and covering the recess 220, 320, 420, 421. For example, the heat dissipating member 26 is bonded onto the plurality of electronic components 21 via a bonding layer 25. Furthermore, the bonding layer 25 is filled in the recess 220, 320, 420, 421, but is free from being filled up the recess 220, 320, 420, 421.

In summary, the electronic package and the method for manufacturing the same in accordance with the present disclosure allows electronic components to be effectively thermally insulated from one another by employing the design of the thermal insulation area, thereby preventing heat generated by an electronic component of high power from being conducted to another electronic component of low power. Thus, the present disclosure can effectively prevent heat generated by the high-power electronic components from adversely affecting the operation of the low-power electronic components so as to improve the reliability of the electronic package.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
a plurality of electronic components; and
an encapsulation layer encapsulating the plurality of electronic components, wherein a spacer is defined in the encapsulation layer and located between at least two adjacent electronic components of the plurality of electronic components, and a recess is formed in the spacer and used as a thermal insulation area, wherein a depth of the recess is greater than a height of the plurality of electronic components, and a bottom of the recess is at a same level as a face of the electronic components.

2. The electronic package of claim 1, wherein the thermal insulation area is filled with air.

3. The electronic package of claim 1, wherein the thermal insulation area is filled with an insulating material.

4. The electronic package of claim 1, wherein a thermal conductivity of the thermal insulation area is less than a thermal conductivity of the encapsulation layer.

5. The electronic package of claim 1, wherein a thermal conductivity of the thermal insulation area is less than 0.02 W/mK.

6. The electronic package of claim 1, wherein a width of the recess is at least 50 μm.

7. The electronic package of claim 1, wherein a thickness of the encapsulation layer at the spacer is at least 10 μm.

8. The electronic package of claim 1, further comprising a carrier carrying and electrically connected with the plurality of electronic components, wherein the carrier includes two opposite sides, such that the plurality of electronic components are disposed on one of the two opposite sides of the carrier, and a plurality of conductive components are disposed on the other one of the two opposite sides of the carrier.

9. The electronic package of claim 1, wherein each of the electronic components includes an active face, a non-active face opposite to the active face, and side faces adjacent to the active face and the non-active face, such that the spacer is connected with the side faces of the plurality of electronic components.

10. The electronic package of claim 9, wherein the recess is exposed from the side faces of the electronic components.

11. The electronic package of claim 1, further comprising a heat dissipating member bonded to the plurality of electronic components and covering the recess.

12. The electronic package of claim 11, wherein the heat dissipating member is bonded onto the plurality of electronic components via a bonding layer.

13. The electronic package of claim 12, wherein the bonding layer is filled in the recess but is free from being filled up the recess.

14. A method for manufacturing an electronic package, comprising:
providing a plurality of electronic components;
encapsulating the plurality of electronic components with an encapsulation layer, wherein a spacer is defined in the encapsulation layer and located between at least two adjacent electronic components of the plurality of electronic components; and
forming a recess in the spacer, wherein the recess is used as a thermal insulation area, a depth of the recess is greater than a height of the plurality of electronic components, and a bottom of the recess is at a same level as a face of the electronic components.

15. The method of claim 14, wherein the thermal insulation area is filled with air.

16. The method of claim 14, wherein the thermal insulation area is filled with an insulating material.

17. The method of claim 14, wherein a thermal conductivity of the thermal insulation area is less than a thermal conductivity of the encapsulation layer.

18. The method of claim 14, wherein a thermal conductivity of the thermal insulation area is less than 0.02 W/mK.

19. The method of claim 14, wherein a width of the recess is at least 50 μm.

20. The method of claim 14, wherein a thickness of the encapsulation layer at the spacer is at least 10 μm.

21. The method of claim 14, further comprising carrying and electrically connecting with the plurality of electronic components by a carrier, wherein the carrier includes two opposite sides, such that the plurality of electronic components are disposed on one of the two opposite sides of the carrier, and a plurality of conductive components are disposed on the other one of the two opposite sides of the carrier.

22. The method of claim 14, wherein each of the electronic components includes an active face, a non-active face opposite to the active face, and side faces adjacent to the active face and the non-active face, such that the spacer is connected with the side faces of the plurality of electronic components.

23. The method of claim 22, wherein the recess is exposed from the side faces of the electronic components.

24. The method of claim 14, further comprising disposing a heat dissipating member onto the plurality of electronic components, wherein the heat dissipating member covers the recess.

25. The method of claim 24, wherein the heat dissipating member is bonded onto the plurality of electronic components via a bonding layer.

26. The method of claim 25, wherein the bonding layer is filled in the recess but is free from being filled up the recess.

\* \* \* \* \*